United States Patent [19]

Bowen et al.

[11] Patent Number: 5,032,898
[45] Date of Patent: Jul. 16, 1991

[54] ELECTRO-OPTIC DEVICE ASSEMBLY HAVING INTEGRAL HEAT SINK/RETENTION MEANS

[75] Inventors: Terry P. Bowen, Etters; Leonard F. Bendiksen, Harrisburg, both of Pa.

[73] Assignee: AMP Incorporated, Harrisburg, Pa.

[21] Appl. No.: 328,323

[22] Filed: Dec. 7, 1981

Related U.S. Application Data

[63] Continuation of Ser. No. 102,041, Dec. 10, 1979, abandoned.

[51] Int. Cl.$^5$ .................. H01L 23/48; H01L 23/02
[52] U.S. Cl. ................................. 357/81; 357/68; 357/74; 350/96.2
[58] Field of Search .................. 357/68, 81, 74; 350/96.2, 96.21

[56] References Cited

U.S. PATENT DOCUMENTS

| 3,447,057 | 5/1969 | Brown et al. | 357/81 |
| 3,549,958 | 12/1970 | Margolien | 357/81 |
| 3,590,341 | 6/1971 | Preston | 357/80 |
| 3,609,471 | 9/1971 | Scace | 357/81 |
| 3,760,175 | 9/1973 | Gibson et al. | 357/81 |
| 3,763,403 | 10/1973 | Lootens | 357/81 |
| 3,783,347 | 1/1974 | Vladik | 357/81 |
| 3,786,317 | 1/1974 | Thierfeider | 357/72 |
| 3,820,153 | 6/1974 | Quinn | 357/81 |
| 3,839,660 | 10/1974 | Stryker | 357/81 |
| 3,946,416 | 3/1976 | Hacskaylo | 357/17 |
| 4,144,541 | 3/1979 | Schaefer et al. | 357/81 |
| 4,151,544 | 4/1979 | Riff | 357/68 |
| 4,167,303 | 9/1979 | Bowen et al. | 350/96.21 |
| 4,186,995 | 2/1980 | Schumacher | 357/74 |
| 4,186,996 | 2/1980 | Bowen et al. | 350/96.20 |
| 4,192,574 | 3/1980 | Henry | 350/96.2 |
| 4,233,619 | 11/1980 | Webb et al. | 357/74 |
| 4,241,978 | 12/1980 | Dubois et al. | 350/96.2 |
| 4,265,512 | 5/1981 | Chiron et al. | 350/96.2 |
| 4,273,413 | 6/1981 | Bendiksen et al. | |
| 4,278,990 | 7/1981 | Fichot | 357/81 |
| 4,307,934 | 12/1981 | Palmer | 357/74 |
| 4,399,453 | 8/1983 | Berg et al. | 357/74 |
| 4,469,401 | 9/1984 | Yamazaki et al. | 350/96.23 |

FOREIGN PATENT DOCUMENTS

| 54-104355 | 8/1979 | Japan | 350/96.2 |
| 54-104356 | 8/1979 | Japan | 350/96.2 |

OTHER PUBLICATIONS

K. Nawata et al, "Active and Passive Devices for Optical Fiber Transmission Systems", *Review of the Electrical Communication Laboratories*, vol. 27 (Nov.-Dec., 1979), pp. 1010-1020.
A. Albanese et al, "LED Array Package for Optical Data Links", *The Bell System Technical Journal*, vol. 58 (Mar., 1979) pp. 713-720.
Technical Disclosure Bulletin: IBM vol. 21, No. 4, Sep. 1978.

*Primary Examiner*—J. Carroll
*Attorney, Agent, or Firm*—Richard B. O'Planick; Gerald K. Kita; Anton P. Ness

[57] ABSTRACT

An electro-optic device assembly and handling technique is disclosed. The assembly comprises an elongate combination heat sink and retention clip, a heat dispersive substrate affixed to one elongate face of the clip and having lead means secured to an outward face thereof, and an electrooptic chip mounted upon the substrate making electrical contact with the leads. A length of waveguide is bonded to an active portion of the chip, and a ferrule member is provided having a profiled passageway for receiving the above assembly therein. Subsequently, the ferrule is inserted into a header housing, and malleable ends of the heat sink clip are inwardly clasped upon the profile of the header housing to secure the heat sink clip, and assembly elements thereupon, to the connector housing.

8 Claims, 2 Drawing Sheets

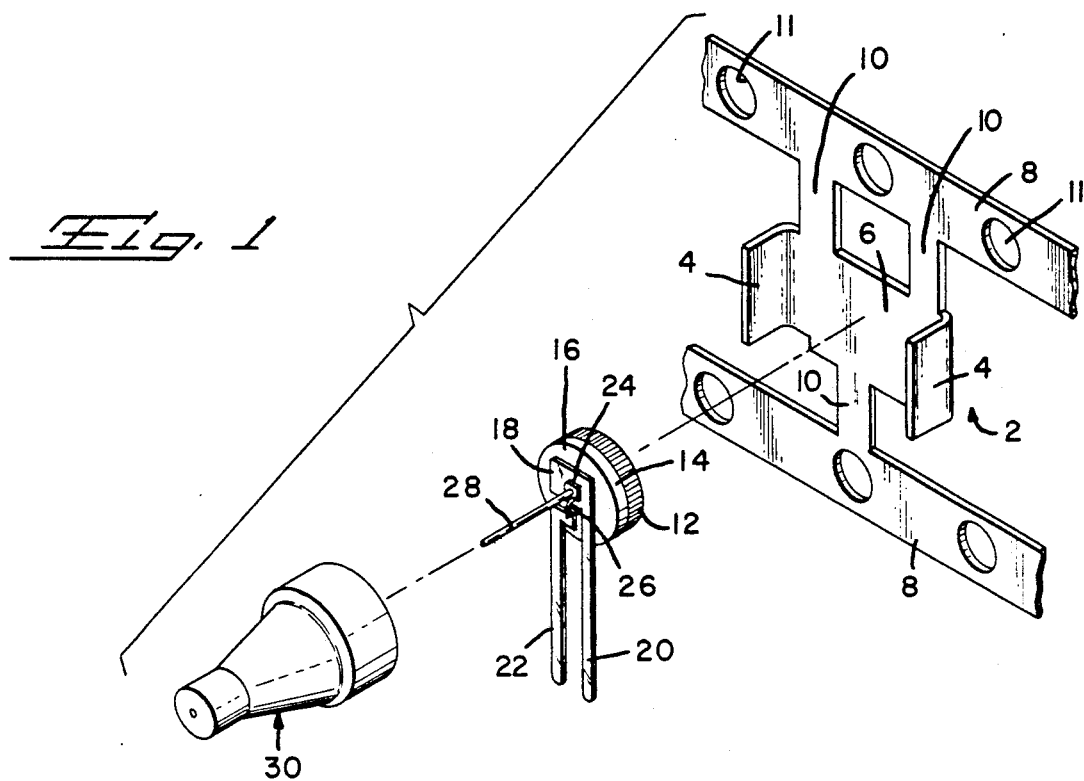
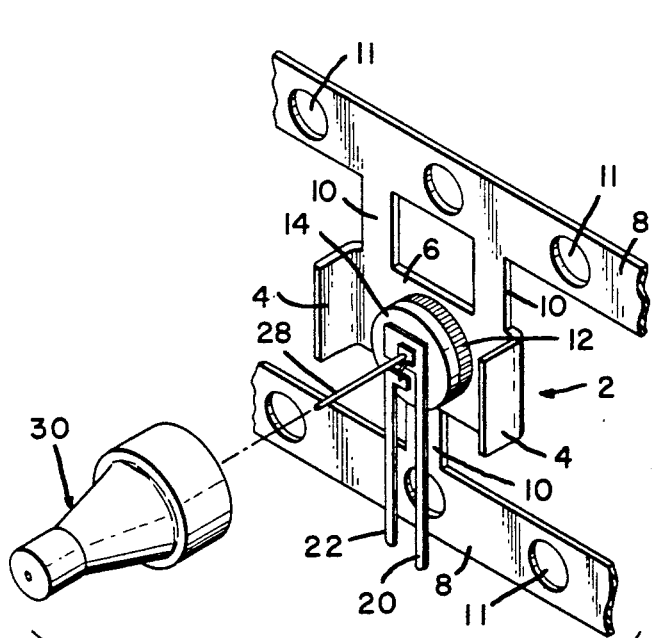
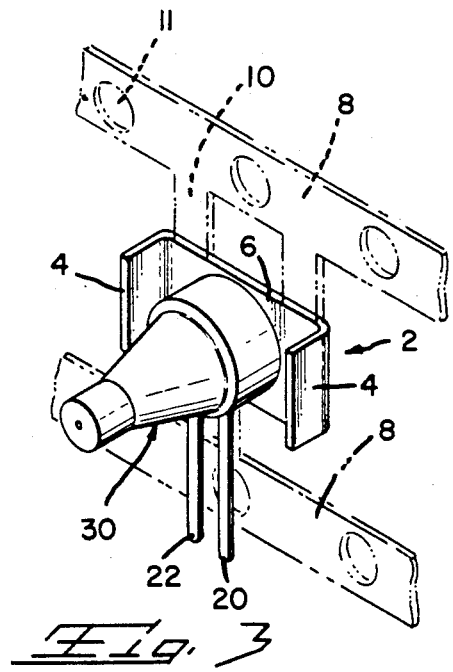

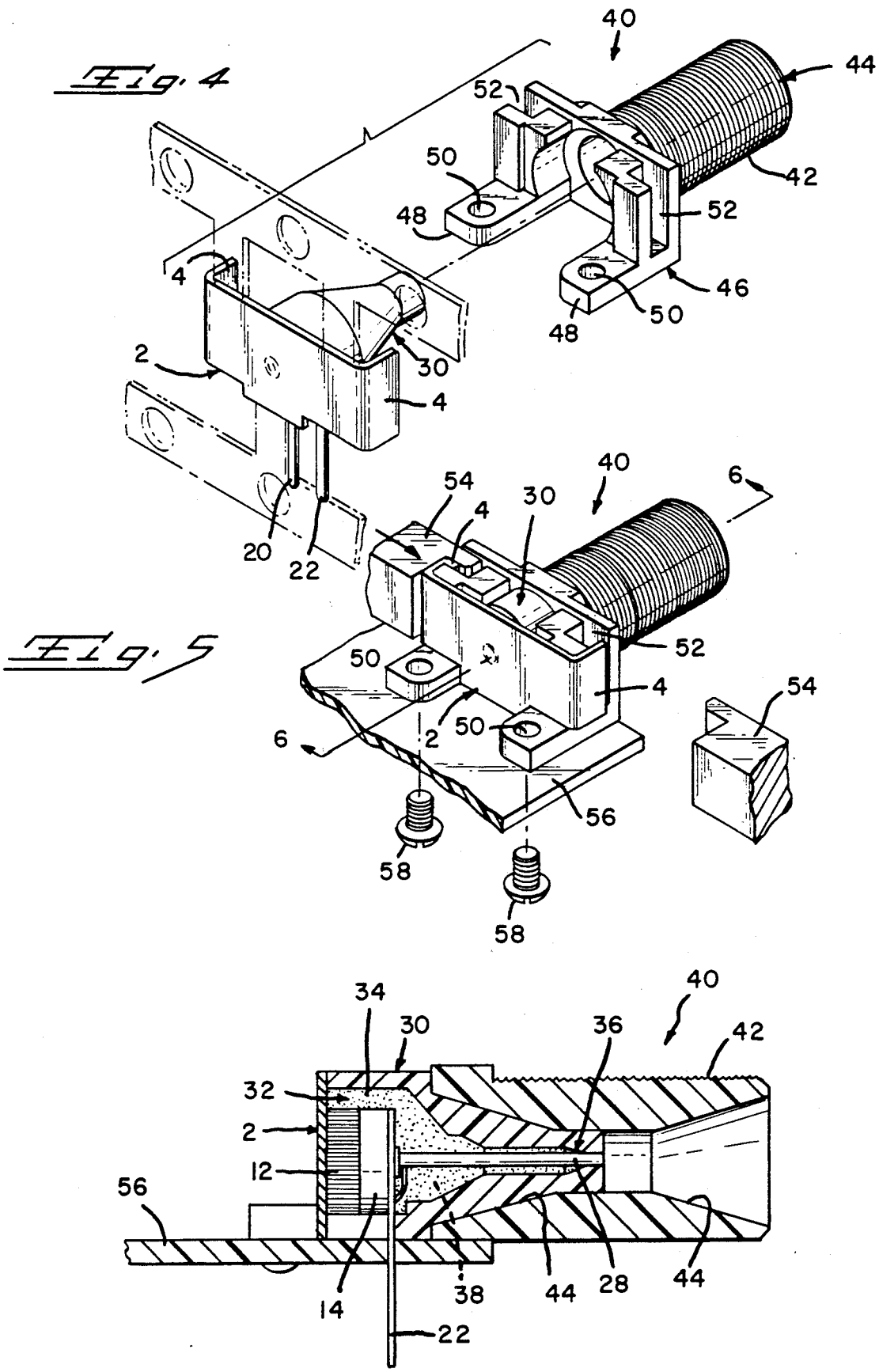

ELECTRO-OPTIC DEVICE ASSEMBLY HAVING INTEGRAL HEAT SINK/RETENTION MEANS

This is a continuation of application Ser. No. 102,041, filed Dec. 10, 1979 abandoned.

BACKGROUND OF THE INVENTION

1. Field of the Invention

The present invention relates broadly to electro-optic PCB headers which employ resilient ferrule alignment technology in aligning a waveguide's end face with an optically active device of the assembly. Specifically, the present invention relates to active device ferrule subassemblies for such headers, having integral heat sink and rentention capability.

2. The Prior Art

Compact packaging techniques for electro-optically active devices facilitating the alignment between an input/output waveguide and the active device, are needed by the electrical industry. One promising approach advocates the incorporation of an electro-optically active device into a resilient ferrule with the ferrule being eventually inserted into a connector housing in alignment with a second ferrule mounted therein. Copending application, Ser. No. 891,793, hereby incorporated by reference, discloses such an assembly, and product produced according to the teachings thereof has met with favorable commercial response.

While the above technique is effective in packaging many active components, relatively high power devices, e.g. Burrus style LED's cannot be so packaged since such devices require heat sinks. Conventionally, a rearwardly projecting stud is used for these types of devices, but utilization of a stud in a ferrule would be awkward. Moreover, assuming a heat sink stud could be conveniently packaged in a ferrule, a separate nut would be required for retaining the ferrule subassembly in a connector housing, and this would necessarily increase the cost of the resulting assembly.

Accordingly, the industry has been in need of a ferrule assembly approach and structure, whereby an active device is packaged in a ferrule assembly having heat sinking means provided for the dispersion of heat generated by the device. Further, a means for retaining the ferrule assembly in a connector housing is needed and, ideally, retention and heat sinking functions would be served by a single assembly component. Finally, because of inherent difficulty in the handling of electro-optic chips, it would be desirable for any proposed active ferrule package to be amenable to semi-automatic assembly techniques for the cost reduction efficiencies thereby achieved.

SUMMARY OF THE PRESENT INVENTION

The present invention obviates the need for a heat sink stud in an active ferrule package, by utilizing the connector housing as a heat sink. A good thermal path is established from the active device within the ferrule, to the housing into which the ferrule is inserted, via an elongate combination heat sink and retention clip. Dielectric and heat dispersive disks are affixed to one elongate surface of the clip, with metalized leads secured to an outer surface of the dielectric disk. An electro-optic chip is mounted upon the substrate in contact with the leads, and a length of waveguide is bonded to an active portion of the chip to enhance the optical exchange efficiency therebetween. A ferrule member is provided having a profiled passageway for receiving the above-summarized subassembly therein, and is thereafter inserted into a connector housing. The malleable ends of the heat sink and retention clip are inwardly clasped upon the profile of the housing to secure the assembly components together, and to continue the thermal path from the chip to the housing. The above assembly can be accomplished in strip form, by semi-automatic tooling, if so desired.

Accordingly, it is an object of the present invention to provide an electro-optic ferrule package and handling technique featured having combination heat sink, retention clip, and chip carrier means.

It is a further object to provide an electro-optic ferrule package amenable to rapid, semi-automative assembly.

A still further object of the present invention is to provide an electro-optic ferrule assembly featured having means for mechanically retaining the ferrule assembly in a connector housing.

Still further, it is an object of the present invention to provide a method of readily assemblying an electro-optic device package.

Another object is to provide an electro-optic ferrule assembly which is economically and readily produced.

These, and other objects which will be apparent to one skilled in the art, are achieved by a preferred embodiment which is described in detail below, and which is illustrated in the accompanying drawings.

BRIEF DESCRIPTION OF THE ACCOMPANYING DRAWINGS

FIG. 1 is an exploded perspective view of the subject electro-optic package, illustrating potential carrier strip assembly thereof.

FIG. 2 is a perspective view of the subject invention at an intermediate stage in the assembly procedure.

FIG. 3 is a perspective view of the present subassembly shown in an assembled condition.

FIG. 4 is a perspective view of the subject electro-optic ferrule package and a PCB connector housing intended to receive the ferrule package therein.

FIG. 5 is a perspective view of the subject assembly illustrating the establishment of clasping retention between the ferrule subassembly and connector housing pursuant to the present invention.

FIG. 6 is a side elevation view in longitudinal section of the subject ferrule subassembly and connector housing in the fully engaged condition.

DETAILED DESCRIPTION OF THE PREFERRED EMBODIMENT

Referring first to FIG. 1, the subject assembly is shown to include a heat sink retention clip 2, having malleable perpendicularly projecting ends 4, and an elongate intermediate body 6. The clip 2 is formed of thermally conductive material, preferably in strip form, whereby a continuous number of the clips 2 (only one of which being shown) are integrally attached to parallel carrier strips 8 by means of integral legs 10. Each carrier strip 8 is provided with serial apertures 11, by which conveyor teeth and assembly apparatus (not shown) engage and advance the strip during assembly in a manner customary to the industry.

The present invention further includes a heat spreading wafer 12 formed of a thermally conductive material such as copper, and a dielectric thermal linkage wafer 14 bonded to the wafer 12, and composed of an electrically insulative, yet thermally transparent, material such as beryllium oxide. A single wafer may be used, if so desired, having dielectric and heat conductive properties. A stamped lead configuration is provided upon an outward face 16 of the wafer 14, comprising a base 18, and electrical leads 20, 22 depending from the wafer face 16 in spaced apart parallel relationship.

An electro-optic chip 24, for example a Burrus-style LED, is bonded to the base 18 in electrical contact with the leads 20, 22 via jumper wire 26, and a discrete length of optical waveguide 28 is bonded to an active area of the chip 24 to optically interface therewith. It will be appreciated that the dependent leads 20, 22 are arranged for intended protrusion through appropriate printed circuit board apertures to engage circuitry thereon, and thereby power the chip 24.

Referring to FIGS. 2 and 6, the thermally conductive wafer 12 is attached to the elongate clip body by a spot weld or other known technique. It should be noted that while the wafers 12, 14, leads 20, 22, chip 24, and waveguide 28 are illustrated and described above as a preassembled unit, it is within the contemplation of the present invention that the above components could be sequentially affixed directly to the clip 2 if so desired. Such a direct assembly would enable the utilization of semi-automatic assembly techniques, and thereby would reduce overall costs involved. A ferrule member 30 is further provided, having a profiled axial passageway 32 (FIG. 6) therethrough, adapted to provide a rearward active-package receiving portion 34, and a forward centering portion 36 dimensioned to only allow an optical waveguide to protrude therethrough. Epoxy adhesive 38, or like material, is provided within the passageway 32 as indicated.

As shown by FIGS. 2 and 6, the ferrule member 30 receives one clip subassembly into the passageway 32, with the discrete length of waveguide protruding through the centering portion 36 of the passageway, and the active device subassembly seated in the passageway portion 34. Thereafter, the epoxy adhesive 38 is permitted to cure, and thereupon secures the ferrule member 30 to the heat sink retention clip portion 6. The subject active device ferrule package is illustrated in the completely assembled condition in FIGS. 3 and 4, and it will be readily appreciated that the above set forth procedure is particularly amenable to semi-automatic assembly techniques since assembly of components to the carrier strip is achieved from one direction.

A connector housing (FIGS. 4 and 6) 40, is adapted having a tubular body 42, with counter disposed, truncate bore 44 extending therein, and a rearward printed circuit board mounting frame 46. The frame 46 includes support legs 48 having mounting apertures 50 therethrough, and a pair of vertical retention slots 52. As shown, the ferrule member 30 is inserted into one of the connector body truncate bores 44, and against the connector frame 46, with the active device leads 20, 22 generally positioned between the frame support legs 48. Thereafter, as shown in FIG. 5, the malleable ends 4 of the heat sink retention clip 2, under the influence of stuffer blades 54, are inwardly clasped about the profile of the connector frame 46, and enter into the slots 52 to securely retain the ferrule package within the connector housing. Preferably, the connector assembly per FIG. 5 is completely assembled in strip form, with the heat sink retention clip 2 subsequently severed from the carrier strips. In this manner, difficulties in handling that would otherwise be loose piece assemblies is overcome. The connector assemblies are intended for mounting to a printed circuit board 56, with screws 58 or rivets projected through appropriate printed circuit board apertures (not shown) and into the mounting leg apertures 50. While printed circuit board mount is one application for the present invention, the assembly method and structure set forth above could be equally applicable to other applications apparent to one skilled in the art. The leads 20, 22 (FIG. 6) are intended to protrude through appropriately provided apertures (not shown) in the printed circuit board to electrically contact circuitry thereon. A further resilient ferrule having an input/output waveguide terminated therein, can be inserted into connector bore 44 opposite the present assembly, in the manner described in the above-identified application hereby incorporated by reference.

Generally viewing FIGS. 1 and 5, it will be apparent that the subject heat sink retention clip 2 provides a good thermal path from the active device 24, via the substrates 12, 14 to the connector housing 40. Thus, the connector housing is efficiently utilized as a heat sink, and ancillary heat sink studs are not required. Further, pursuant to the structure described above, the overall connector assembly profile is relatively narrow, and thereby conserves valuable board space. Lastly, the clip 2 serves the dual functions of heat sink and retention.

The present invention may be subject to many modifications without departing from the spirit of essential characteristics thereof. The present embodiment should therefore be considered as illustrative and not restrictive of the scope of the subject invention.

What is claimed is:

1. An electro-optic device assembly, comprising:
   an elongate thermally-conductive member of malleable material having end portions extending substantially normal thereto;
   opto-electrical assembly means including means for transferring thermal energy affixed substantially orthogonally to said thermally-conductive member, electrical lead means secured to an outer surface of said thermal energy transfer means, opto-electrically active device means electrically connected to said electrical lead means;
   a length of optical waveguide having one end affixed to an active area of said opto-electrically active device means;
   ferrule means having an outer profiled surface and a longitudinal passageway therethrough, said passageway having a large rearward portion in which said opto-electrical assembly means is disposed and a smaller forward portion along which said optical waveguide extends; and
   housing means having a profiled cavity in which said outer profiled surface of said ferrule means is disposed and engaging means engaged by respective end portions securing said thermally-conductive member to said housing means.

2. An electro-optic device assembly as set forth in claim 1 wherein said thermal energy transfer means includes a thermally-conductive metal member secured to said thermally-conductive member and a dielectric thermal linkage member secured to said conductive metal member.

3. An electro-optic device assembly as set forth in claim 1 wherein said housing means has heat sink characteristics so that a thermal path is established from said opto-electrical assembly means via said thermally-conductive member to said housing means.

4. A fiber optic semiconductor device having a low thermal impedance comprising:
   a thermally conductive header;
   a semiconductor chip, having a photo-active area, thermally connected to said header;
   a segment of fiber optically connected to said photo-active area; and
   heat spreader means thermally coupled to said header, said heat spreader means extending outwardly from said header for conducting heat away from said semiconductor chip;
   a cylindrical, thermally conductive member orthogonal to and thermally connected to said heat spreader means; and
   plastic enclosure means engaging said heat spreader means for enclosing said semiconductor chip, said cylindrical member, and said fiber, said fiber extending through a surface of said enclosure means, and wherein said cylindrical member conducts heat away from said semiconductor chip through said enclosure means.

5. A fiber optic semiconductor device assembly, comprising:
   a thermally-conductive member;
   semiconductor chip means having a photoactive area thermally connected to said thermally-conductive member;
   optical waveguide means optically connected to said photoactive area of said semiconductor chip means;
   heat-spreading means thermally coupled to said thermally-conductive member and extending outwardly from said thermally-conductive member for conducting heat away from said semiconductor chip means;
   enclosure means engaging said heat-spreading means thereby enclosing said semiconductor chip means and said optical waveguide means, said optical waveguide means extending through an end surface of said enclosure means and wherein said thermally-conductive member and said heat-spreading means conducts heat away from said semiconductor chip means through said enclosing means; and
   mounting means as part of said heat-spreading means for mounting said enclosure means in a housing member.

6. A fiber optic semiconductor device as set forth in claim 5, wherein said heat-spreading means includes a heat-spreading wafer.

7. A fiber optic semiconductor device as set forth in claim 5, wherein said enclosure means has a profiled bore extending therethrough and including a first section in which said thermally-conductive member, said semiconductor chip means and an inner part of said optical waveguide means are disposed and a second section along which an outer part of said optical waveguide means extends to an outer front surface of said enclosure means.

8. A fiber optic semiconductor device as set forth in claim 7, wherein said enclosure means has an outer profiled configuration for matable engagement with a complementary bore in the housing member.

* * * * *